(12) United States Patent
Wei et al.

(10) Patent No.: US 12,159,060 B2
(45) Date of Patent: Dec. 3, 2024

(54) DATA WRITING METHOD AND APPARATUS, AND STORAGE MEDIUM

(71) Applicant: INNOGRIT TECHNOLOGIES CO., LTD., Shanghai (CN)

(72) Inventors: Tao Wei, Shanghai (CN); Zhengtian Feng, Shanghai (CN); Ke Wei, Shanghai (CN)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 99 days.

(21) Appl. No.: 17/831,126

(22) Filed: Jun. 2, 2022

(65) Prior Publication Data

US 2023/0297282 A1 Sep. 21, 2023

(30) Foreign Application Priority Data

Mar. 16, 2022 (CN) .......................... 202210258759.4

(51) Int. Cl.
*G06F 3/06* (2006.01)
*G11C 8/08* (2006.01)

(52) U.S. Cl.
CPC .......... *G06F 3/0659* (2013.01); *G06F 3/0613* (2013.01); *G06F 3/0679* (2013.01); *G11C 8/08* (2013.01)

(58) Field of Classification Search
None
See application file for complete search history.

(56) References Cited

U.S. PATENT DOCUMENTS

| | | | | |
|---|---|---|---|---|
| 8,386,699 B2* | 2/2013 | Yeh | ...................... | G06F 3/0611 |
| | | | | 711/170 |
| 9,794,342 B2* | 10/2017 | Chiba | ................... | G06F 3/0689 |
| 10,102,138 B2* | 10/2018 | Lin | ......................... | G06F 12/10 |
| 2011/0179414 A1* | 7/2011 | Goggin | ................. | G06F 3/0683 |
| | | | | 718/1 |
| 2013/0073795 A1* | 3/2013 | Hasegawa | .......... | G06F 12/0238 |
| | | | | 711/E12.008 |
| 2020/0310643 A1* | 10/2020 | Li | ........................... | G06F 3/061 |
| 2021/0255949 A1* | 8/2021 | Guda | .................. | G06F 12/0292 |
| 2022/0291833 A1* | 9/2022 | Alam | ..................... | G06F 3/0601 |
| 2023/0244411 A1* | 8/2023 | Szubbocsev | ......... | G06F 3/0604 |

* cited by examiner

*Primary Examiner* — Elias Mamo
(74) *Attorney, Agent, or Firm* — WOMBLE BOND DICKINSON (US) LLP

(57) ABSTRACT

The present disclosure relates to a data writing method and apparatus of a NAND flash, and a storage medium. The method includes: for each channel in the NAND flash, pairing all logic units, namely LUNs, in the channel so that each LUN pair includes at least two LUNs; and for each LUN pair, sequentially writing data to one same page in a plurality of pages corresponding to a program mode included in each word line of each LUN in the LUN pair, and after completing data writing to the same page of the word line of all the LUNs in the LUN pair, sequentially writing data to a next same page in the plurality of pages of the word line of each LUN in the LUN pair, until the data writing is sequentially performed on a last same page in the plurality of pages of the word line of each LUN in the LUN pair. Therefore, the transmission efficiency of a NAND bus can be improved, and the data writing performance of the NAND flash can be improved.

12 Claims, 7 Drawing Sheets

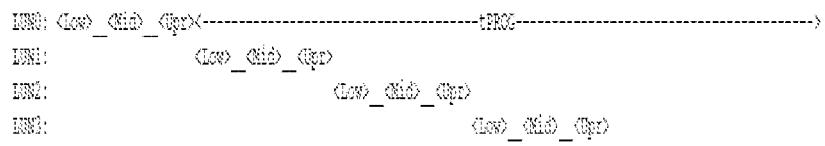

FIG.1a

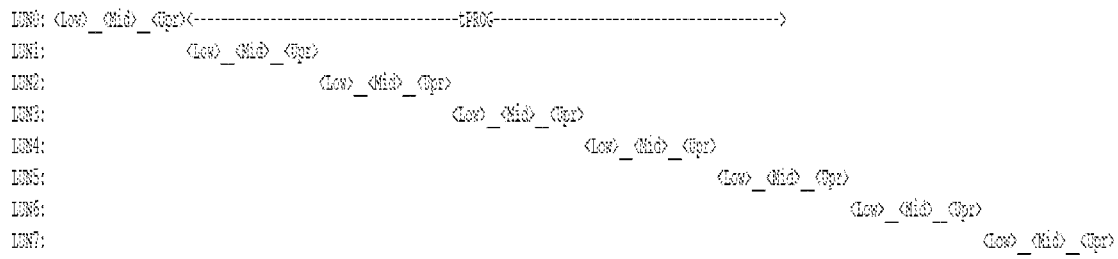

FIG.1b

| for each channel of a NAND flash, pairing all logic units, namely LUNs, in the channel so that each LUN pair includes at least two LUNs | S110 |

| for each LUN pair, sequentially writing data to one same page in a plurality of pages corresponding to a program mode included in each word line of each LUN in the LUN pair, and after completing data writing to the same page of the word line of all the LUNs in the LUN pair, sequentially writing data to a next same page in the plurality of pages of the word line of each LUN in the LUN pair, ... and so on, until the data writing is sequentially performed on a last same page in the plurality of pages of the word line of each LUN in the LUN pair | S130 |

FIG.1c

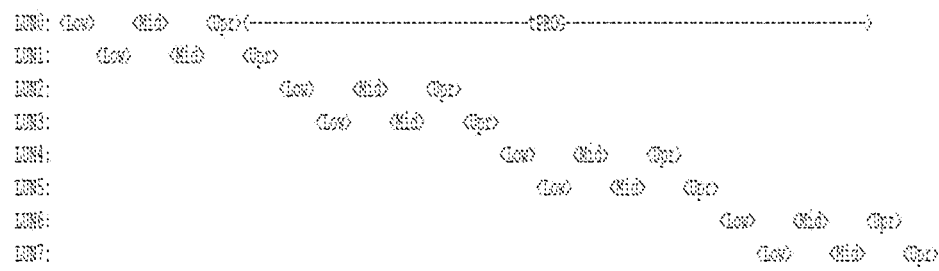

FIG.1d

```
for each channel of a NAND flash, pairing all the LUNs in the channel so that
each LUN pair includes a first LUN and a second LUN, wherein each word line     S210
of the first LUN and the second LUN includes an LP page, an MP page, and a
                              UP page, respectively
```

```
for each word line of each LUN pair, performing data writing in a manner of:
performing data writing on the LP page of the first LUN in the LUN pair;
performing data writing on the LP page of the second LUN in the LUN pair;       S230
performing data writing on the MP page of the first LUN in the LUN pair;
performing data writing on the MP page of the second LUN in the LUN pair;
performing data writing on the UP page of the first LUN in the LUN pair; and
performing data writing on the UP page of the second LUN in the LUN pair
```

FIG.2

DATA WRITING METHOD AND APPARATUS, AND STORAGE MEDIUM

TECHNICAL FIELD

The present disclosure relates to the technical field of storage, in particular to a data writing method and apparatus, and a storage medium.

BACKGROUND

Solid State Drive (SSD) is a hard disk made of solid-state electronic memory chip arrays. The SSD can adopt a NAND flash as storage medium, the SSD can include an SSD controller and a plurality of NAND flashes, and the SSD controller and the NAND flashes are placed on a Printed Circuit Board (PCB) and connected through the PCB.

The NAND controller can be in communication with several NAND channels. Each channel is connected to one or more Chip Enable (CE) signals, and each CE can correspond to one or more logic units (LUN). Therefore, a plurality of LUNs can exist on one channel.

For the channel where the NAND controller is connected to a CE group, all targets and the LUNs share the same NAND bus. Therefore, the transmission efficiency of the NAND bus may affect the data writing performance (referred to as writing performance) of the NAND flash.

SUMMARY

In view of this, the present disclosure provides a data writing method and apparatus, and a storage medium to improve the transmission efficiency of a NAND bus, so as to improve the data writing performance of a NAND flash.

According to a first aspect of the present disclosure, there is provided a data writing method for a NAND flash, applied to a NAND controller. The method includes: for each channel of the NAND flash, pairing all logic units, namely LUNs, in the channel so that each LUN pair includes at least two LUNs; and for each LUN pair, sequentially writing data to one same page in a plurality of pages corresponding to a program mode included in each word line of each LUN in the LUN pair, and after completing data writing to the same page of the word line of all the LUNs in the LUN pair, sequentially writing data to a next same page in the plurality of pages of the word line of each LUN in the LUN pair, until the data writing is sequentially performed on a last same page in the plurality of pages of the word line of each LUN in the LUN pair.

In a possible implementation, for each channel of the NAND flash, all the LUNs in the channel are paired so that each LUN pair includes a first LUN and a second LUN, wherein each word line of the first LUN and the second LUN includes an LP page, an MP page, and a UP page, respectively, and for each word line of each LUN pair, data writing is performed in a manner of: performing data writing on the LP page of the first LUN in the LUN pair; performing data writing on the LP page of the second LUN in the LUN pair; performing data writing on the MP page of the first LUN in the LUN pair; performing data writing on the MP page of the second LUN in the LUN pair; performing data writing on the UP page of the first LUN in the LUN pair; and performing data writing on the UP page of the second LUN in the LUN pair.

In a possible implementation, for each channel of the NAND flash, all the LUNs in the channel are paired to enable each LUN pair to include a first LUN and a second LUN, wherein each word line of the first LUN and the second LUN includes an LP page, an MP page, a UP page, and a TP page, respectively, and for each word line of each LUN pair, data writing is performed in a manner of: performing data writing on the LP page of the first LUN in the LUN pair; performing data writing on the LP page of the second LUN in the LUN pair; performing data writing on the MP page of the first LUN in the LUN pair; performing data writing on the MP page of the second LUN in the LUN pair; performing data writing on the UP page of the first LUN in the LUN pair; performing data writing on the UP page of the second LUN in the LUN pair; performing data writing on the TP page of the first LUN in the LUN pair; and performing data writing on the TP page of the second LUN in the LUN pair.

In a possible implementation, the pairing step includes: for each channel of the NAND flash, determining the number of the LUNs included in the LUN pair; and pairing all the LUNs in the channel to enable each LUN pair to include the determined number of the LUNs.

In a possible implementation, the determining the number of the LUNs included in the LUN pair includes: calculating a ratio of program cache busy time to data transmission time; based on that the ratio is less than 1, determining that each LUN pair includes 2 LUNs; and based on that the ratio is equal to M, determining that each LUN pair includes M+1 LUNs, where M is an integer greater than 1.

According to a second aspect of the present disclosure, there is provided a data writing apparatus for a NAND flash, applied to a NAND controller. The apparatus includes: a pairing module configured to, for each channel of the NAND flash, pair all logic units, namely LUNs, in the channel so that each LUN pair includes at least two LUNs; and a writing module configured to, for each LUN pair, sequentially write data to one same page in a plurality of pages corresponding to a program mode included in each word line of each LUN in the LUN pair, and after completing data writing to the same page of the word line of all the LUNs in the LUN pair, sequentially write data to a next same page in the plurality of pages of the word line of each LUN in the LUN pair, until the data writing is sequentially performed on a last same page in the plurality of pages of the word line of each LUN in the LUN pair.

In a possible implementation, the pairing module is configured to: for each channel of the NAND flash, pair all the LUNs in the channel to enable each LUN pair to include a first LUN and a second LUN, wherein each word line of the first LUN and the second LUN includes an LP page, an MP page, and a UP page, respectively, and the writing module is configured to: for each word line of each LUN pair, perform data writing in a manner of: perform data writing on the LP page of the first LUN in the LUN pair; performing data writing on the LP page of the second LUN in the LUN pair; performing data writing on the MP page of the first LUN in the LUN pair; performing data writing on the MP page of the second LUN in the LUN pair; performing data writing on the UP page of the first LUN in the LUN pair; and performing data writing on the UP page of the second LUN in the LUN pair.

In a possible implementation, the pairing module is configured to: for each channel of the NAND flash, pair all the LUNs in the channel so that each LUN pair included a first LUN and a second LUN, wherein each word line of the first LUN and the second LUN includes an LP page, an MP page, a UP page, and a TP page, respectively, and the writing module is configured to: for each word line of each LUN pair, perform data writing in a manner of: performing data writing on the LP page of the first LUN in the LUN pair; performing data writing on the LP page of the second LUN in the LUN pair; performing data writing on the MP page of the first LUN in the LUN pair; performing data writing on the MP page of the second LUN in the LUN pair; performing data writing on the UP page of the first LUN in the LUN pair; performing data writing on the UP page of the second LUN in the LUN pair; performing data writing on the TP page of the first LUN in the LUN pair; and performing data writing on the TP page of the second LUN in the LUN pair.

In a possible implementation, the pairing module is configured to: for each channel of the NAND flash, determine the number of the LUNs included in the LUN pair; and pair all the LUNs in the channel to enable each LUN pair to include the determined number of the LUNs.

In a possible implementation, the pairing module is configured to: calculate a ratio of program cache busy time to data transmission time; based on that the ratio is less than 1, determine that each LUN pair includes 2 LUNs; and based on that the ratio is equal to M, determine that each LUN pair includes M+1 LUNs, where M is an integer greater than 1.

According to a third aspect of the present disclosure, there is provided a data writing apparatus, including: a processor; and a memory for storing processor executable instructions, wherein the processor is configured to implement, when executing the instructions stored in the memory, the method.

According to a fourth aspect of the present disclosure, there is provided a non-volatile computer-readable storage medium having computer program instructions stored thereon, wherein the computer program instructions, when executed by a processor, implement the method.

According to a fifth aspect of the present disclosure, there is provided a computer program product, including computer-readable codes, or a non-volatile computer-readable storage medium carrying the computer-readable codes, and when the computer-readable codes are run in a processor of an electronic device, the processor in the electronic device executes the method.

According to the data writing method, apparatus and the storage medium provided by the present disclosure, all the LUNs in each channel of the NAND flash are paired first, and then data transmission is sequentially and alternately performed within each LUN pair. In this way, even if tPCBSY is short, no waste is caused. During the short busy period of one LUN, data transmission of other LUN in the LUN pair can be performed, so that the short tPCBSY is effectively used for data transmission alternately. Therefore, the transmission efficiency of the NAND bus can be improved, thereby the data writing performance of the NAND flash can be improved, and even the data writing performance of the NAND flash can be closer to the limit level.

Other features and aspects of the present disclosure will be apparent according to the following detailed description made on the exemplary embodiments with reference to the accompanying drawings.

BRIEF DESCRIPTION OF THE DRAWINGS

The accompanying drawings, which are incorporated in and constitute a part of the present description, illustrate exemplary embodiments, features and aspects of the present disclosure and serve to explain the principles of the present disclosure together with the description.

FIG. 1a is a schematic diagram of data writing of an SSD under normal conditions illustrated according to one exemplary embodiment.

FIG. 1B is a schematic diagram of data writing of a large-capacity SSD illustrated according to one exemplary embodiment.

FIG. 1c is a flowchart of a data writing method illustrated according to one exemplary embodiment.

FIG. 1d is a schematic diagram of data writing after data writing is performed on a large-capacity SSD by using a data writing method of an embodiment illustrated according to one exemplary embodiment.

FIG. 2 is a flowchart of a data writing method illustrated according to one exemplary embodiment.

DETAILED DESCRIPTION

Figure 3:
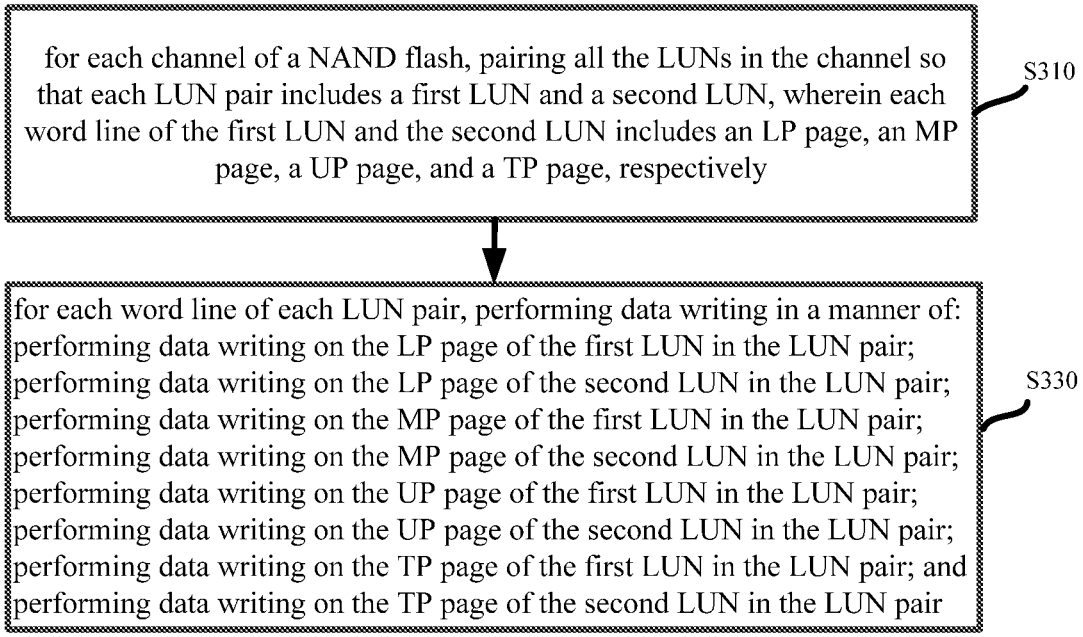
FIG. 3 is a flowchart of a data writing method illustrated according to one exemplary embodiment.

Various exemplary embodiments, features and aspects of the present disclosure are described in detail below with reference to the accompanying drawings. Same reference signs in the drawings indicate elements with same or similar functions. Although various aspects of the embodiments are illustrated in the drawings, the drawings are unnecessary to draw to scale unless otherwise specified.

The special word "exemplary" herein means "using as an example and an embodiment or being illustrative." Any embodiments described herein as "exemplary" should not be construed as being superior or better than other embodiments.

Furthermore, for better describing the present disclosure, numerous specific details are illustrated in the following detailed description. Those skilled in the art should understand that the present disclosure may be implemented without certain specific details. In some examples, methods, means, elements and circuits that are well known to those skilled in the art are not described in detail in order to highlight the main idea of the present disclosure.

It should be understood that each LUN can include one or more planes, each plane can include a plurality of blocks, each block can include a plurality of word lines (WL), and each word line can include one or more pages. For example, each NAND flash can include 2 targets, each target can include 1 LUN, the LUN can include 2 planes, each plane can include 1478 blocks, and each block can include 768 pages. In another example, each NAND flash can include 4 targets, each target can include 2 LUNs, each LUN can include 2 planes, each plane can include 4096 blocks, and each block can include 256 pages.

The program mode of the NAND flash can include a Single-Level Cell (SLC) mode, a Multi-Level Cell (MLC) mode, a Triple-Level Cell (TLC) mode, and a Quadruple-Level Cell (QLC) mode. When programming in the SLC mode, 1 page needs to be programmed for each programming; when programming in the MLC mode, 2 pages need to be programmed for each programming; when programming in the TLC mode, 3 pages of an LP (low page) page, an MP (middle page) page, and a UP (upper page) page need to be programmed simultaneously for each programming; and when programming in the QLC mode, 4 pages of an LP page, an MP page, a UP page, and a TP (top page) page need to be programmed simultaneously for each programming.

Taking TLC as an example, each word line can include 3 pages of the LP page, the MP page, and the UP page. Taking QLC as an example, each word line can include 4 pages of the LP page, the MP page, the UP page, and the TP page.

Taking TLC mode programming as an example, a Program Cache Busy Time (tPCBSY) exists after programming the LP page and the MP page. The tPCBSY is relatively short, and generally less than 5 microseconds (us). After programming the UP page, a Program Operation Time (tPROG) exists, and the tPROG is relatively long, and can be 2 or 3 milliseconds (ms).

Since multiple targets can be connected to each channel, and each target can include one or more LUNs, multiple targets and a plurality of LUNs can exist on one channel, and the multiple targets and the plurality of LUNs share the same NAND bus. For each WL of each LUN, the LP page/MP page/UP page needs to be programmed sequentially.

In a related art, assuming that each LUN includes word lines of $WL_1$, $WL_2$, $WL_3$ ... $WL_{N-1}$, and $WL_N$, the $WL_1$ of one LUN is programmed first in the sequence of the LP page/the MP page/the UP page, then the $WL_1$ of a next LUN is programmed in the sequence of the LP page/the MP page/the UP page, and then, the $WL_1$ of the LUN after the next LUN is programmed in the sequence of the LP page/the MP page/the UP page, until all the LUNs are traversed; then, the $WL_2$ of one LUN is programmed in the sequence of the LP page/the MP page/the UP page, then, the $WL_2$ of the next LUN is programmed in the sequence of the LP page/the MP page/the UP page, and then, the $WL_2$ of the LUN after the next LUN is programmed in the sequence of the LP page/the MP page/the UP page, until all the LUNs are traversed; then, the $WL_3$ of one LUN is programmed in the sequence of the LP page/the MP page/the UP page, then, the $WL_3$ of the next LUN is programmed in the sequence of the LP page/the MP page/the UP page, and then, the $WL_3$ of the LUN after the next LUN is programmed in the sequence of the LP page/the MP page/the UP page, until all the LUNs are traversed; and . . . , and so on, until the $WL_N$ of all the LUNs are traversed.

However, when it is necessary to support large-capacity SSDs, or under a condition that the transmission speed of the NAND bus is low, a busy time (tPCBSY) exists between the programming of the LP page and the programming of the MP page, and between the programming of the MP page and the programming of the UP page (if programming in the QLC mode, further between the programming of the UP page and the programming of the TP page), and no data transmission is performed during the busy time, that is, the NAND bus is idle.

In a case where the NAND bus is not the performance bottleneck of the NAND flash (for example, the capacity of the NAND flash is relatively small, the number of the LUNs is relatively small, or the transmission speed of the NAND bus is relatively high), the transmission efficiency of the NAND bus shall be able to meet the requirement of data writing performance of the NAND flash, so that it is unnecessary to improve the transmission efficiency of the NAND bus.

Exemplarily, assuming that 4 LUNs of LUN0, LUN1, LUN2, and LUN3 exist on one channel of the NAND flash (that is, the number of the LUNs is relatively small), then, as shown in FIG. 1a, for each word line of the 4 LUNs, programming is performed in a manner of: programming the LP page of the LUN0; programming the MP page of the LUN0; programming the UP page of the LUN0; programming the LP page of the LUN1; programming the MP page of the LUN1; programming the UP page of the LUN1; programming the LP page of the LUN2; programming the MP page of the LUN2; programming the UP page of the LUN2; programming the LP page of the LUN3; programming the MP page of the LUN3; and programming the UP page of the LUN3. Therefore, the tPCBSY does not have a great impact on the performance of the NAND flash. Relatively, the tPROG has a greater impact on the performance of the NAND flash, that is, the tPROG is the performance bottleneck of the NAND flash. Therefore, it does not matter even if the NAND bus waits in idleness for a short period of time of the tPCBSY.

However, in a case where the NAND bus becomes the performance bottleneck of the NAND flash (for example, the capacity of the NAND flash is too large, the number of the LUNs is too large, and/or the transmission speed of the NAND bus is too low), the transmission efficiency of the NAND bus may not be able to meet the requirement of data writing performance of the NAND flash, so that the efficiency of the NAND bus needs to be improved, and the data writing performance of the NAND flash needs to be improved.

Exemplarily, assuming that 8 LUNs of the LUN0, the LUN1, the LUN2, the LUN3, LUN4, LUN5, LUN6, and LUN7 exist on one channel of the NAND flash (that is, the number of the LUNs is relatively large). Then, as shown in FIG. 1B, for each word line of the 8 LUNs, programming is performed in a manner of: programming the LP page of the LUN0; programming the MP page of the LUN0; programming the UP page of the LUN0; programming the LP page of the LUN1; programming the MP page of the LUN1; programming the UP page of the LUN1; programming the LP page of the LUN2; programming the MP page of the LUN2; programming the UP page of the LUN2; programming the LP page of the LUN3; programming the MP page of the LUN3; programming the UP page of the LUN3; programming the LP page of the LUN4; programming the MP page of the LUN4; programming the UP page of the LUN4; programming the LP page of the LUN5; programming the MP page of the LUN5; programming the UP page of the LUN5; programming the LP page of the LUN6; programming the MP page of the LUN6; programming the UP page of the LUN6; programming the LP page of the LUN7; programming the MP page of the LUN7; and programming the UP page of the LUN7.

Referring to FIG. 1B, during the busy time between the LP page and the MP page, the NAND controller waits for the NAND bus and the NANA bus is idle without transmitting data. Meanwhile, due to the large number of the LUNs, interval time between time corresponding to the transmission data of one LUN corresponding to a word line such as $WL_N$ and time corresponding to the transmission data of one LUN corresponding to the next word line such as $WL_{N+1}$ is long, the interval time exceeds the tPROG, but the LUN still needs to wait for the transmission of the NAND bus, that is, no data writing operation is performed inside a NAND array.

Therefore, the NAND bus and the NAND array may wait for each other at different times, that is, the NAND bus does not transmit data and data writing operation is not performed in the NAND array, which may result in unideal data writing performance of the NAND flash.

For this purpose, the present disclosure provides a data writing method and apparatus, and a storage medium to improve the transmission efficiency of the NAND bus, so as to improve the data writing performance of the NAND flash.

FIG. 1c shows a flowchart of the data writing method of the NAND flash according to one embodiment of the present disclosure, and the data writing method can be applied to the NAND controller of the NAND flash. As shown in FIG. 1c, the data writing method can include a step of:

in step S110, for each channel in the NAND flash, all the LUNs in the channel are paired to enable each LUN pair to include at least two LUNs. The step corresponds to the pairing step.

In the embodiment, each channel includes a plurality of LUNs, and all the LUNs on each channel can be grouped in a predetermined pairing manner. Each group of the LUNs can be called an LUN pair, and each LUN pair can include two or more LUNs.

In a possible implementation, the predetermined pairing manner includes grouping all the LUNs on each channel, so that each group of LUNs includes 2 LUNs. Exemplarily, for the NAND flash as shown in FIG. 1B, 8 LUNs of the LUN0, the LUN1, the LUN2, the LUN3, the LUN4, the LUN5, the LUN6, and the LUN7 exist on one channel, the 8 LUNs included on the channel are grouped in the predetermined pairing manner, and can be grouped into 4 LUN pairs. The 4 LUN pairs are a first LUN pair consisting of the LUN0 and the LUN1, a second LUN pair consisting of the LUN2 and the LUN3, a third LUN pair consisting of the LUN4 and the LUN5, and a fourth LUN pair consisting of the LUN6 and the LUN7.

In a possible implementation, the predetermined pairing manner includes grouping all the LUNs on each channel, so that each group of LUNs includes a predetermined number of LUNs, wherein the predetermined number is relevant with the tPCBSY. Exemplarily, for the NAND flash as shown in FIG. 1B, the 8 LUNs included in the channel are grouped in the predetermined pairing manner, and can be grouped into (8/predetermined number) LUN pairs. If the predetermined number is 4, the 8 LUNs can be grouped into 2 LUN pairs. The 2 LUN pairs are the first LUN pair consisting of the LUN0, the LUN1, the LUN2, and the LUN3, and the second LUN pair consisting of the LUN4, the LUN5, the LUN6, and the LUN7.

After pairing all the LUNs in the channel, the step S130 below is executed.

In step S130: for each LUN pair, data writing is sequentially performed on one same page in a plurality of pages corresponding to the program mode included in each word line of each LUN in the LUN pair, and after data writing to the same page of the word line of all the LUNs in the LUN pair is completed, data writing is sequentially performed to a next same page in the plurality of pages of the word line of each LUN in the LUN pair, . . . and so on, until the data writing is sequentially performed on a last same page in the plurality of pages of the word line of each LUN in the LUN pair. The step corresponds to the writing step.

In the embodiment, for each LUN pair, data writing is sequentially performed on the first page in the plurality of pages corresponding to the program mode included in each word line of each LUN in the LUN pair, after data writing to the first page of the word line of all the LUNs in the LUN pair is completed, data writing is sequentially performed on the second page in the plurality of pages of the word line of each LUN in the LUN pair, and after data writing to the second page of the word line of all the LUNs in the LUN pair is completed, data writing is sequentially performed on the third page in the plurality of pages of the word line of each LUN in the LUN pair, . . . and so on, until data writing to the last page in the plurality of pages of each word line of each LUN in the LUN pair is completed.

The number of the pages corresponding to the program mode included in each word line (that is, the plurality of pages) varies according to the program mode of the NAND flash. For the TLC mode, the number of the pages included in each word line is 3, and the 3 pages are the LP page, the MP page, and the UP page respectively. For the QLC mode, the number of the pages included in each word line is 4, and the 4 pages are the LP page, the MP page, the UP page, and the TP page respectively.

In a possible implementation, for each channel of the NAND flash, all the LUNs in the channel are paired to enable each LUN pair to include a first LUN and a second LUN, wherein each word line of the first LUN and the second LUN includes the LP page, the MP page, and the UP page, and for each word line of each LUN pair, data writing is performed in a manner of: performing data writing on the LP page of the first LUN in the LUN pair; performing data writing on the LP page of the second LUN in the LUN pair; performing data writing on the MP page of the first LUN in the LUN pair; performing data writing on the MP page of the second LUN in the LUN pair; performing data writing on the UP page of the first LUN in the LUN pair; and performing data writing on the UP page of the second LUN in the LUN pair.

Referring to FIG. 2, in step S210, for each channel of the NAND flash, all the LUNs in the channel can be grouped in a pairing manner in which all the LUNs on the channel are grouped to enable each group of LUNs to include 2 LUNs, so that each LUN pair includes a first LUN and a second LUN, and is programmed in the TLC mode. Therefore, each word line of the first LUN and the second LUN includes the LP page, the MP page, and the UP page respectively. Correspondingly, in step S230, data writing can be performed on each word line pair of each LUN in a manner of: sequentially performing data writing on the LP pages of the first LUN and the second LUN in the LUN pair; sequentially performing data writing on the MP pages of the first LUN and the second LUN in the LUN pair; and sequentially performing data writing on the UP pages of the first LUN and the second LUN in the LUN pair.

Continuing the above example, for the NAND flash as shown in FIG. 1B, it is assumed that the 8 LUNs of the LUN0, the LUN1, the LUN2, the LUN3, the LUN4, the LUN5, the LUN6, and the LUN7 on one channel are grouped in a predetermined pairing manner into a first LUN pair consisting of the LUN0 and the LUN1, a second LUN pair consisting of the LUN2 and the LUN3, a third LUN pair consisting of the LUN4 and the LUN5, and a fourth LUN pair consisting of the LUN6 and the LUN7, and programming is performed in the TLC mode, then data writing can be performed in a manner of:

for each word line of the first LUN pair, performing data writing on the LP page of the LUN0 in the first LUN pair, then performing data writing on the LP page of the LUN1 in the first LUN pair, performing data writing on the MP page of the LUN0 in the first LUN pair, then performing data writing on the MP page of the LUN1 in the first LUN pair, performing data writing on the UP page of the LUN0 in the first LUN pair, and then performing data writing on the UP page of the LUN1 in the first LUN pair;

for each word line of the second LUN pair, performing data writing on the LP page of the LUN2 in the second LUN pair, then performing data writing on the LP page of the LUN3 in the second LUN pair, performing data writing on the MP page of the LUN2 in the second LUN pair, then performing data writing on the MP page of the LUN3 in the second LUN pair, performing data writing on the UP page of the LUN2 in the second LUN pair, and then performing data writing on the UP page of the LUN3 in the second LUN pair;

for each word line of the third LUN pair, performing data writing on the LP page of the LUN4 in the third LUN pair, then performing data writing on the LP page of the LUN5 in the third LUN pair, performing data writing on the MP page of the LUN4 in the third LUN pair, then performing data writing on the MP page of the LUN5 in the third LUN pair, performing data writing on the UP page of the LUN4 in the third LUN pair, and then performing data writing on the UP page of the LUN5 in the third LUN pair; and for each word line of the fourth LUN pair, performing data writing on the LP page of the LUN6 in the fourth LUN pair, then performing data writing on the LP page of the LUN7 in the fourth LUN pair, performing data writing on the MP page of the LUN6 in the fourth LUN pair, then performing data writing on the MP page of the LUN7 in the fourth LUN pair, performing data writing on the UP page of the LUN6 in the fourth LUN pair, and then performing data writing on the UP page of the LUN7 in the fourth LUN pair.

Therefore, data transmission is sequentially performed on each word line of the first LUN pair, the second LUN pair, the third LUN pair, and the fourth LUN pair alternately, so that during tPCBSY, data transmission can be performed on another LUN in the LUN pair. Therefore, the short busy time between the LP page and the MP page and the short busy time between the MP page and the UP page can be effectively used, and the transmission efficiency of the NAND bus can be improved, so that the data writing performance of the NAND flash can be improved.

Compared with data writing in the data writing manner in the prior art (see FIG. 1B for the diagram of data writing), the data writing method of the embodiment is used to perform data writing on the large-capacity SSD, see FIG. 1d, the LUN pairs sequentially transmit data alternately, and even if the tPCBSY is short, no waste is caused. During a short busy period of a LUN, the data of the LUN pair can be transmitted. Therefore, the short tPCBSY is effectively used for alternate data transmission. Consequently, the transmission efficiency of the NAND bus can be improved, and the data writing performance of the NAND flash can be improved.

In a possible implementation, for each channel of the NAND flash, all the LUNs in the channel are paired to enable each LUN pair to include a first LUN and a second LUN, wherein each word line of the first LUN and the second LUN includes an LP page, an MP page, a UP page, and a TP page, and for each word line of each LUN pair, data writing is performed in a manner of: performing data writing on the LP page of the first LUN in the LUN pair; performing data writing on the LP page of the second LUN in the LUN pair; performing data writing on the MP page of the first LUN in the LUN pair; performing data writing on the MP page of the second LUN in the LUN pair; performing data writing on the UP page of the first LUN in the LUN pair; performing data writing on the UP page of the second LUN in the LUN pair; performing data writing on the TP page of the first LUN in the LUN pair; and performing data writing on the TP page of the second LUN in the LUN pair.

Referring to FIG. 3, in step S310, for each channel of the NAND flash, all the LUNs in the channel can be grouped in a pairing manner in which all the LUNs on the channel are grouped to enable each group of LUNs to include 2 LUNs, so that each LUN pair includes a first LUN and a second LUN, and is programmed in the QLC mode. Therefore, each word line of the first LUN and the second LUN includes the LP page, the MP page, the UP page, and the TP page respectively. Correspondingly, in step S330, data writing can be performed on each word line of each LUN pair in a manner of: sequentially performing data writing on the LP pages of the first LUN and the second LUN in the LUN pair; sequentially performing data writing on the MP pages of the first LUN and the second LUN in the LUN pair; sequentially performing data writing on the UP pages of the first LUN and the second LUN in the LUN pair; and sequentially performing data writing on the TP pages of the first LUN and the second LUN in the LUN pair.

Continuing the above example, it is assumed that the 8 LUNs of the LUN0, the LUN1, the LUN2, the LUN3, the LUN4, the LUN5, the LUN6, and the LUN7 on one channel are grouped in a predetermined pairing manner into a first LUN pair consisting of the LUN0 and the LUN1, a second LUN pair consisting of the LUN2 and the LUN3, a third LUN pair consisting of the LUN4 and the LUN5, and a fourth LUN pair consisting of the LUN6 and the LUN7, and programming is performed in the QLC mode, then data writing can be performed in a manner of:

for each word line of the first LUN pair, performing data writing on the LP page of the LUN0 in the first LUN pair, then performing data writing on the LP page of the LUN1 in the first LUN pair, performing data writing on the MP page of the LUN0 in the first LUN pair, then performing data writing on the MP page of the LUN1 in the first LUN pair, performing data writing on the UP page of the LUN0 in the first LUN pair, then performing data writing on the UP page of the LUN1 in the first LUN pair, performing data writing on the TP page of the LUN0 in the first LUN pair, and then performing data writing on the TP page of the LUN1 in the first LUN pair;

for each word line of the second LUN pair, performing data writing on the LP page of the LUN2 in the second LUN pair, then performing data writing on the LP page of the LUN3 in the second LUN pair, performing data writing on the MP page of the LUN2 in the second LUN pair, then performing data writing on the MP page of the LUN3 in the second LUN pair, performing data writing on the UP page of the LUN2 in the second LUN pair, then performing data writing on the UP page of the LUN3 in the second LUN pair, performing data writing on the TP page of the LUN2 in the second LUN pair, and then performing data writing on the TP page of the LUN3 in the second LUN pair;

for each word line of the third LUN pair, performing data writing on the LP page of the LUN4 in the third LUN pair, then performing data writing on the LP page of the LUN5 in the third LUN pair, performing data writing on the MP page of the LUN4 in the third LUN pair, then performing data writing on the MP page of the LUN5 in the third LUN pair, performing data writing on the UP page of the LUN4 in the third LUN pair, then performing data writing on the UP page of the LUN5 in the third LUN pair, performing data writing on the TP page of the LUN4 in the third LUN pair, and then performing data writing on the TP page of the LUN5 in the third LUN pair; and for each word line of the fourth LUN pair, performing data writing on the LP page of the LUN6 in the fourth LUN pair, then performing data writing on the LP page of the LUN7 in the fourth LUN pair, performing data writing on the MP page of the LUN6 in the fourth LUN pair, then performing data writing on the MP page of the LUN7 in the fourth LUN pair, performing data writing on the UP page of the LUN6 in the fourth LUN pair, then performing data writing on the UP page of the LUN7 in the fourth LUN pair, performing data writing on the TP page of the LUN6 in the fourth LUN pair, and then performing data writing on the TP page of the LUN7 in the fourth LUN pair.

Therefore, data transmission is sequentially performed for each word line of the first LUN pair, the second LUN pair, the third LUN pair, and the fourth LUN pair alternately, so that during tPCBSY, data transmission can be performed on another LUN in the LUN pair. Therefore, the short busy time between the LP page and the MP page, the short busy time between the MP page and the UP page, and the short busy time between the UP page and the TP page can be effectively used, and the transmission efficiency of the NAND bus can be improved, so that the data writing performance of the NAND flash can be improved.

Therefore, according to the data writing method of the embodiment, firstly, all the LUNs in each channel of the NAND flash are paired, and then data transmission is sequentially performed on each word line of each LUN pair alternately. In this way, even if the tPCBSY is short, no waste is caused. During the short busy period of a LUN, data transmission of other LUN in the LUN pair can be performed. Therefore, the short tPCBSY is effectively used for alternate data transmission. Therefore, the transmission efficiency of the NAND bus can be improved, the data writing performance of the NAND flash can be improved, and even the data writing performance of the NAND flash can be closer to the limit level.

In a possible implementation, all the LUNs in the channel can be paired in a manner of: for each channel of the NAND flash, determining the number of the LUNs included in the LUN pair; and pairing all the LUNs in the channel to enable each LUN pair to include the determined number of the LUNs.

In the embodiment, the pairing manner to be used for pairing is relevant with the number of the LUNs included in the paired LUN pair. Therefore, the number of the LUNs included in the LUN pair can be determined based on the pairing manner to be used for pairing. Exemplarily, assuming that the pairing manner to be used for pairing is to group all the LUNs on each channel so that each group of LUNs includes 2 LUNs, then the number of the LUNs included in the LUN pair can be determined to be 2 based on the pairing manner. Then, the adjacent LUNs of the number in the channel can be paired into one LUN pair. Continuing the example, every 2 LUNs in the same channel can be paired. For a specific example of pairing, reference can be made to the description of step S110, which will not be repeated here.

In a possible implementation, the number of the LUNs included in the LUN pair can be determined in a manner of: calculating a ratio of program cache busy time (tPCBSY) to data transmission time; under a condition that the ratio is less than 1, determining that each LUN pair includes 2 LUNs; and under a condition that the ratio is equal to M, determining that each LUN pair includes M+1 LUNs, where M is an integer greater than 1.

Figure 4:
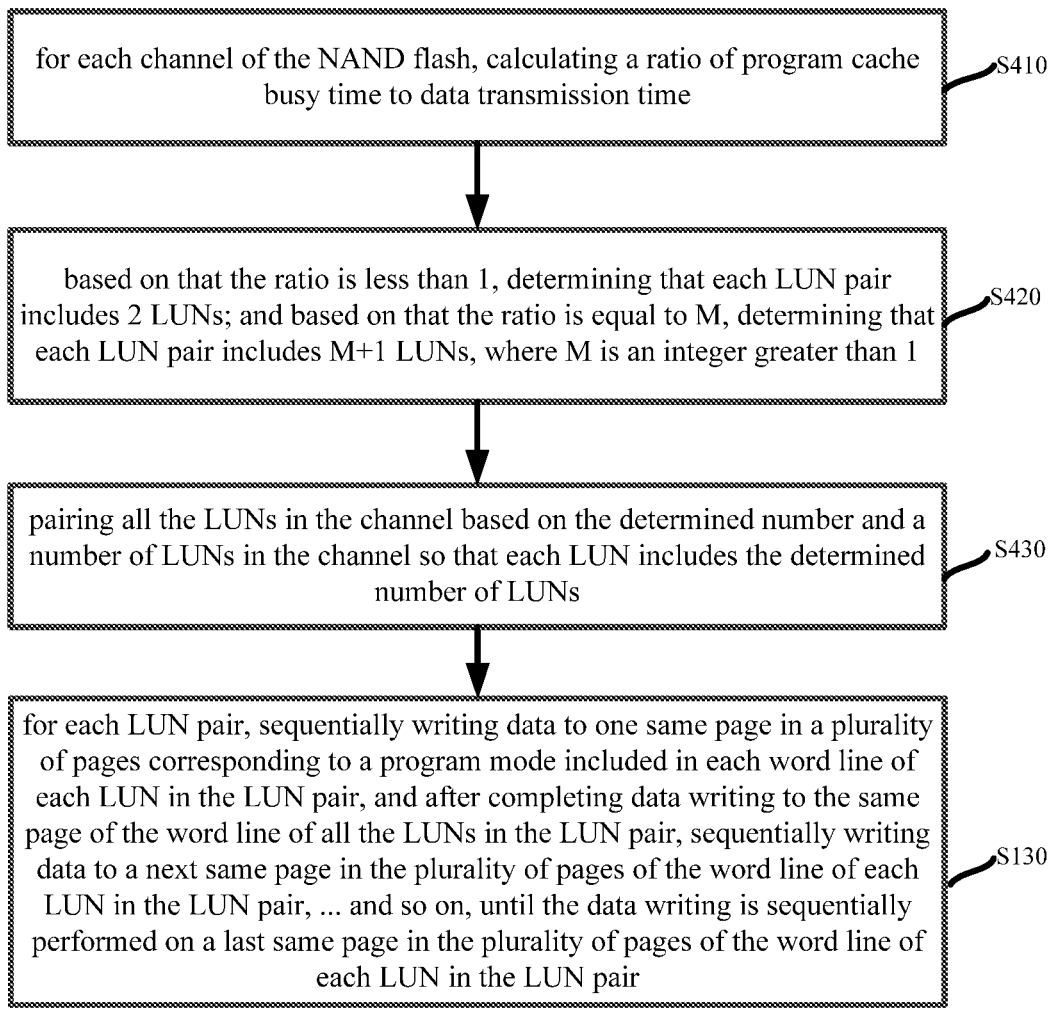
FIG. 4 is a flowchart of a data writing method illustrated according to one exemplary embodiment.

Referring to FIG. 4, the number of the LUNs included in the LUN pair can be determined by executing steps S410, S420, and S430. Specifically, the ratio of the tPCBSY to the data transmission time can be calculated; whether the ratio is less than 1 or greater than 1 is judged; and if the ratio is less than 1, it means that the data transmission time is greater than tPCBSY, and pairwise pairing is sufficient, so that the number of the LUNs included in the LUN pair is 2. Usually, the tPCBSY is short, generally less than 5 microseconds, and is less than the data transmission time, so that pairwise pairing is suitable.

If the ratio is greater than 1, for example, tPCBSY=M times of the data transmission time, then the M+1 LUNs are paired, that is, the number of the LUNs included in the LUN pair is M+1. Therefore, during tPCBSY, data transmission of M LUNs can be performed.

Figure 5:
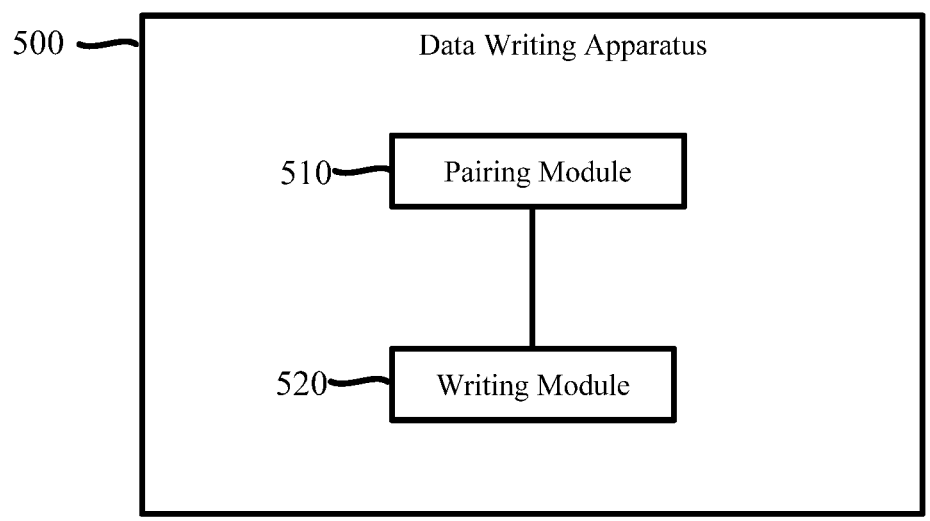
FIG. 5 is a block diagram of a data writing apparatus illustrated according to one exemplary embodiment.

FIG. 5 is a block diagram of a data writing apparatus illustrated according to one exemplary embodiment. The data writing apparatus 500 can be applied to the NAND controller of the NAND flash. As shown in FIG. 5, the data writing apparatus 500 can include a pairing module 510 and a writing module 520.

The pairing module 510 is configured to: for each channel of the NAND flash, pair all logic units in the channel, namely LUNs, to enable each LUN pair to include at least two LUNs. The writing module 520 is connected with the pairing module 510, and is configured to: for each LUN pair, sequentially write data to one same page in a plurality of pages corresponding to the program mode included in each word line of each LUN in the LUN pair, and after completing data writing to the same page of the word line of all the LUNs in the LUN pair, sequentially write data to the next same page in the plurality of pages of the word line of each LUN in the LUN pair, . . . and so on, until the data writing is sequentially performed on the last same page in the plurality of pages of the word line of each LUN in the LUN pair.

In a possible implementation, the pairing module 510 can be configured to: for each channel of the NAND flash, pair all the LUNs in the channel to enable each LUN pair to include a first LUN and a second LUN, wherein each word line of the first LUN and the second LUN includes the LP page, the MP page, and a UP page; the writing module 520 can be configured to: for each word line of each LUN pair, perform data writing in a manner of: performing data writing on the LP page of the first LUN in the LUN pair; performing data writing on the LP page of the second LUN in the LUN pair; performing data writing on the MP page of the first LUN in the LUN pair; performing data writing on the MP page of the second LUN in the LUN pair; performing data writing on the UP page of the first LUN in the LUN pair; and performing data writing on the UP page of the second LUN in the LUN pair.

In a possible implementation, the pairing module 510 can be configured to: for each channel of the NAND flash, pair all the LUNs in the channel to enable each LUN pair to include a first LUN and a second LUN, wherein each word line of the first LUN and the second LUN includes the LP page, the MP page, the UP page, and the TP page; the writing module 520 can be configured to: for each word line of each LUN pair, perform data writing in a manner of: performing data writing on the LP page of the first LUN in the LUN pair; performing data writing on the LP page of the second LUN in the LUN pair; performing data writing on the MP page of the first LUN in the LUN pair; performing data writing on the MP page of the second LUN in the LUN pair; performing data writing on the UP page of the first LUN in the LUN pair; performing data writing on the UP page of the second LUN in the LUN pair; performing data writing on the TP page of the first LUN in the LUN pair; and performing data writing on the TP page of the second LUN in the LUN pair.

In a possible implementation, the pairing module 510 can be configured to: for each channel of the NAND flash, determine the number of the LUNs included in the LUN pair; and pair all the LUNs in the channel to enable each LUN pair to include the determined number of the LUNs.

In a possible implementation, the pairing module 510 can be configured to: calculate a ratio of program cache busy time to data transmission time; under a condition that the ratio is less than 1, determine that each LUN pair includes 2 LUNs; and under a condition that the ratio is equal to M, determine that each LUN pair includes M+1 LUNs, where M is an integer greater than 1.

Figure 6:
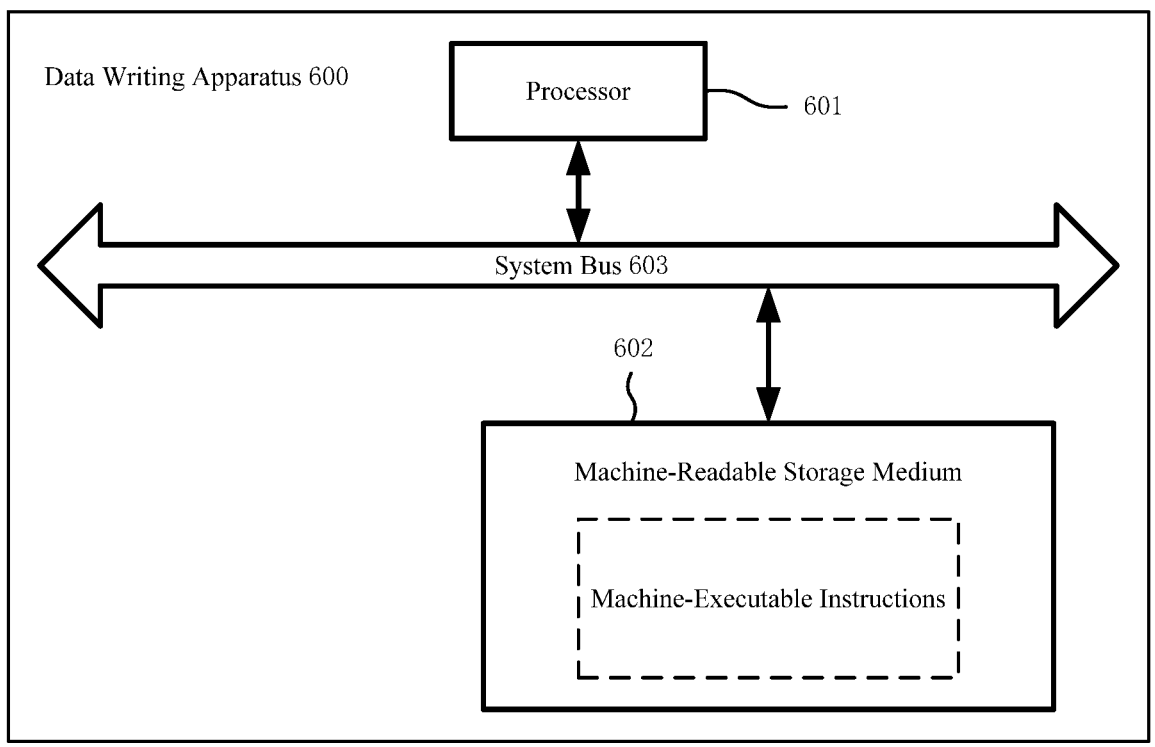
FIG. 6 is a block diagram of a data writing apparatus illustrated according to one exemplary embodiment.

FIG. 6 is a block diagram of the data writing apparatus illustrated according to one exemplary embodiment. Referring to FIG. 6, the data writing apparatus 600 can include a processor 601 and a machine-readable storage medium 602 storing machine-executable instructions. The processor 601 and the machine-readable storage medium 602 can communicate via the system bus 603. Also, the processor 601 executes the data writing method described above by reading the machine-executable instructions corresponding to the data writing method of the data writing apparatus in the machine-readable storage medium 602.

The machine-readable storage medium 602 mentioned in the present disclosure can be any electronic, magnetic, optical or other physical storage apparatuses, and can contain or store information, such as executable instructions and data, etc. For example, the machine-readable storage medium can be: a RAM (Random Access Memory), a volatile memory, a non-volatile memory, a flash, a storage drive (such as a hard disk drive), a solid state drive, any type of storage disks (such as CD-ROM and dvd), or similar storage media, or combinations thereof.

Figure 7:
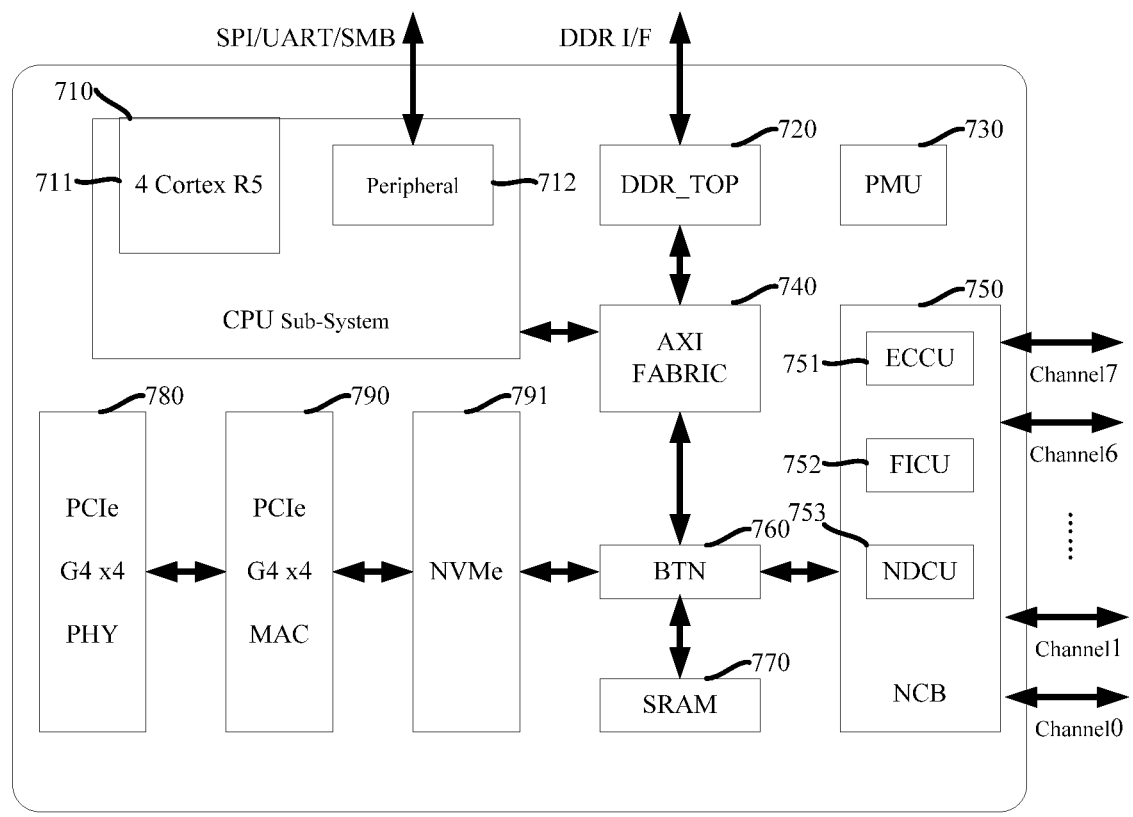
FIG. 7 is a system architecture block diagram of a data writing apparatus illustrated according to one exemplary embodiment.

FIG. 7 is a system architecture block diagram of the data writing apparatus illustrated according to one exemplary embodiment. Referring to FIG. 7, the system can include: a CPU subsystem 710, DDR_TOP 720, PMU 730, AXI FABRIC 740, NCB 750, BTN 760, SRAM 770, PCIe PHY 780, PCIe MAC 790, and NVMe 791.

The CPU subsystem 710 can include 4 Cortex R5 711 and a peripheral 712. The 4 Cortex R5 711 is an ARM CPU and can be used to run corresponding software, and the peripheral 712 can be connected with SPI/UART/SMB. An SPI (Serial Peripheral Interface) represents a serial peripheral interface, and the CPU subsystem 710 can be externally connected with an SPI FLASH through the SPI. A UART (Universal Asynchronous Receiver/Transmitter) represents a universal asynchronous receiver/transmitter, and an SMB (System Management Bus) represents a system management bus, and can be used for debugging.

A DDR_TOP 720 is a DDR (Double Data Rate) memory controller, and is used to manage the DDR memory. The DDR_TOP 720 can be externally connected with the DDR memory through a DDR I/F (interface), and manage the DDR memory. An AXI (Advanced Extensible Interface) FABRIC 740 is an AXI bus, and is used to connect each module. Exemplarily, the DDR_TOP 720 can be connected with the BTN 760 via the AXI FABRIC 740. A BTN (Buffer Table NAND) 760 is used to manage a dtag (Data tag) in the SRAM 770, and the SRAM 770 is a memory which can store programs and data, and is about several megabytes. A part of the memory is obtained by dividing the SRAM 770 to store host data which is generally about 4 KB, and each dtag represents a 4 KB storage unit.

A PMU (Power Management Unit) 730 is a power management unit. When idle, the host triggers the PMU 730 or the PMU 730 triggers voluntarily to enter a low power consumption mode, so as to achieve low power consumption. A PCIe (peripheral component interconnect express) PHY (physical layer) 780 and PCIe MAC (media access control) 790 are the part of a front interface, namely, the part connected to a motherboard slot. An NVMe (Non-Volatile Memory express) 791 is a processing part of a front-end NVMe protocol.

The NCB (NAND Control Block) 750 represents a NAND control block, and can include an ECCU 751, an FICU 752, and an NDCU 753, wherein, ECCU (Error Correction & Control Unit) 751 represents an error correction & control unit, and is mainly used for ECC error correction when encoding and decoding data after considering that the data written to the NAND flash can have error bits. Therefore, if the data written to the NAND flash is subjected to ECC parity, cyclic redundancy check (CRC) and other processing, when the written data is read from the NAND flash, decoding error detection can be performed, and if an error is detected, ECC error correction is performed.

The FICU (Flash Instruction Control Unit) 752 represents a flash instruction control unit, and is mainly used for communication between firmware and NCB hardware, and more abstract instructions are usually used for communication between the firmware and the NCB hardware. The FICU 752 can be used to parse the abstract instructions, and if parsing of the abstract instructions is complete, the FICU 752 can notify firmware command completion.

The NDCU (NAND Control Unit) 753 represents a NAND control unit, in other words, the NDCU 753 can correspond to the NAND controller, and is mainly used to configure the NAND protocol, send corresponding commands, and perform processing of configurations and the like related to signals. Referring to FIG. 7, the NCB 750 is also correspondingly provided with a channel 0, a channel 1 . . . a channel 6, and a channel 7, a total of 8 channels. Of course, it should be understood that the NCB 750 can also be provided with other numbers of channels, which will not be expanded due to space limitations. For the configuration and description of each channel, reference can be made to the above description of the channel, which will not be repeated here.

It should be understood that the data writing method and apparatus in the embodiment can be used for the system as shown in FIG. 7, and in a possible implementation, when the system is run, the data writing method and apparatus can be applied to the NDCU 753 of the system, so that the transmission efficiency of the NAND bus can be improved, and the data writing performance of the NAND flash can be improved.

In some embodiments, the functions or modules included in the apparatus provided in the embodiments of the present disclosure can be used to execute the methods described by the above method embodiments. For specific implementation, reference can be made to the above method embodiments, which will not be repeated here for simplicity.

The embodiment of the present disclosure further provides a computer-readable storage medium having computer program instructions stored thereon, wherein the computer program instructions implement, when executed by a processor, the method. The computer-readable storage medium can be the volatile or non-volatile computer-readable storage medium.

Embodiments of the present disclosure further provide a computer program product, which includes computer-readable codes, or the non-volatile computer-readable storage medium carrying the computer-readable codes. When the computer-readable codes are run in a processor of a data writing apparatus, the processor in the data writing apparatus executes the data writing method.

Although the embodiments of the present disclosure have been described above, it will be appreciated that the above descriptions are merely exemplary, but not exhaustive; and that the disclosed embodiments are not limiting. A number of variations and modifications may occur to those of ordinary skilled the art without departing from the scopes and spirits of the described embodiments. The terms in the present disclosure are selected to provide the best explanation on the principles or practical applications of the embodiments or the technical improvements to the arts on market, or to make the embodiments described herein understandable to others of ordinary skill in the art.

What is claimed is:

1. A data writing method for a NAND flash applied to a NAND controller, comprising:
  for each channel of the NAND flash, pairing all logic units, namely LUNs, in the channel so that each LUN pair includes at least two LUNs, the pairing comprising:
    for each channel of the NAND flash, determining a number of the LUNs included in the LUN pair by
      calculating a ratio of program cache busy time to data transmission time;
      based on that the ratio is less than 1, determining that each LUN pair includes two LUNs; and
      based on that the ratio is equal to M, determining that each LUN pair includes M+1 LUNs, where M is an integer greater than 1; and
    pairing all the LUNs in the channel so that each LUN pair includes the determined number of the LUNs; and
  for each LUN pair, sequentially writing data to one same page in a plurality of pages corresponding to a program mode included in each word line of each LUN in the LUN pair, and after completing data writing to the same page of the word line of all the LUNs in the LUN pair, sequentially writing data to a next same page in the plurality of pages of the word line of each LUN in the LUN pair, until the data writing is sequentially performed on a last same page in the plurality of pages of the word line of each LUN in the LUN pair.

2. The data writing method of claim 1, wherein
  for each channel of the NAND flash, all the LUNs in the channel are paired so that each LUN pair includes a first LUN and a second LUN, wherein each word line of the first LUN and the second LUN includes an LP page, an MP page, and a UP page, respectively;
  for each word line of each LUN pair, data writing is performed in a manner of:
    performing data writing on the LP page of the first LUN in the LUN pair;
    performing data writing on the LP page of the second LUN in the LUN pair;
    performing data writing on the MP page of the first LUN in the LUN pair;
    performing data writing on the MP page of the second LUN in the LUN pair;
    performing data writing on the UP page of the first LUN in the LUN pair; and
    performing data writing on the UP page of the second LUN in the LUN pair.

3. The data writing method of claim 1, wherein
  for each channel of the NAND flash, all the LUNs in the channel are paired so that each LUN pair includes a first LUN and a second LUN, wherein each word line of the first LUN and the second LUN includes an LP page, an MP page, a UP page, and a TP page, respectively;
  for each word line of each LUN pair, data writing is performed in a manner of:
    performing data writing on the LP page of the first LUN in the LUN pair;
    performing data writing on the LP page of the second LUN in the LUN pair;
    performing data writing on the MP page of the first LUN in the LUN pair;
    performing data writing on the MP page of the second LUN in the LUN pair;
    performing data writing on the UP page of the first LUN in the LUN pair;
    performing data writing on the UP page of the second LUN in the LUN pair;
    performing data writing on the TP page of the first LUN in the LUN pair; and
    performing data writing on the TP page of the second LUN in the LUN pair.

4. A data writing apparatus for a NAND flash, applied to a NAND controller, comprising:
  a pairing module configured to, for each channel of the NAND flash, pair-perform pairing all logic units, namely LUNs, in the channel so that each LUN pair includes at least two LUNs, the pairing including, for each channel of the NAND flash, determining a number of the LUNs included in the LUN pair by
    calculating a ratio of program cache busy time to data transmission time;
    based on that the ratio is less than 1, determining that each LUN pair includes two LUNs; and
    based on that the ratio is equal to M, determining that each LUN pair includes M+1 LUNs, where M is an integer greater than 1; and
  pairing all the LUNs in the channel so that each LUN pair includes the determined number of the LUNs; and
  a writing module configured to, for each LUN pair, sequentially write data to one same page in a plurality of pages corresponding to a program mode included in each word line of each LUN in the LUN pair, and after completing data writing to the same page of the word line of all the LUNs in the LUN pair, sequentially write data to a next same page in the plurality of pages of the word line of each LUN in the LUN pair, until the data writing is sequentially performed on a last same page in the plurality of pages of the word line of each LUN in the LUN pair.

5. The data writing apparatus of claim 4, wherein
  the pairing module is configured to: for each channel of the NAND flash, pair all the LUNs in the channel so that each LUN pair includes a first LUN and a second LUN, wherein each word line of the first LUN and the second LUN includes an LP page, an MP page, and a UP page, respectively;
  the writing module is configured to: for each word line of each LUN pair, perform data writing in a manner of:
    performing data writing on the LP page of the first LUN in the LUN pair;
    performing data writing on the LP page of the second LUN in the LUN pair;
    performing data writing on the MP page of the first LUN in the LUN pair;
    performing data writing on the MP page of the second LUN in the LUN pair;
    performing data writing on the UP page of the first LUN in the LUN pair; and
    performing data writing on the UP page of the second LUN in the LUN pair.

6. The data writing apparatus of claim 4, wherein
  the pairing module is configured to: for each channel of the NAND flash, pair all the LUNs in the channel so that each LUN pair includes a first LUN and a second LUN, wherein each word line of the first LUN and the second LUN includes an LP page, an MP page, a UP page, and a TP page, respectively;

the writing module is configured to: for each word line of each LUN pair, perform data writing in a manner of:
performing data writing on the LP page of the first LUN in the LUN pair;
performing data writing on the LP page of the second LUN in the LUN pair;
performing data writing on the MP page of the first LUN in the LUN pair;
performing data writing on the MP page of the second LUN in the LUN pair;
performing data writing on the UP page of the first LUN in the LUN pair;
performing data writing on the UP page of the second LUN in the LUN pair;
performing data writing on the TP page of the first LUN in the LUN pair; and
performing data writing on the TP page of the second LUN in the LUN pair.

7. A data writing apparatus, comprising:
a processor; and
a memory for storing processor executable instructions, wherein
the processor is configured to invoke the instructions stored in the memory, so as to perform:
for each channel of a NAND flash, pairing all logic units, namely LUNs, in the channel so that each LUN pair includes at least two LUNs, the pairing including, for each channel of the NAND flash, determining a number of the LUNs included in the LUN pair by
calculating a ratio of program cache busy time to data transmission time;
based on that the ratio is less than 1, determining that each LUN pair includes two LUNs; and
based on that the ratio is equal to M, determining that each LUN pair includes M+1 LUNs, where M is an integer greater than 1; and
pairing all the LUNs in the channel so that each LUN pair includes the determined number of the LUNs; and
for each LUN pair, sequentially writing data to one same page in a plurality of pages corresponding to a program mode included in each word line of each LUN in the LUN pair, and after completing data writing to the same page of the word line of all the LUNs in the LUN pair, sequentially writing data to a next same page in the plurality of pages of the word line of each LUN in the LUN pair, until the data writing is sequentially performed on a last same page in the plurality of pages of the word line of each LUN in the LUN pair.

8. A non-volatile computer-readable storage medium having computer program instructions stored thereon, wherein the computer program instructions are executed by a processor, the processor is caused to perform operations of:
for each channel of a NAND flash, pairing all logic units, namely LUNs, in the channel so that each LUN pair includes at least two LUNs, the pairing including, for each channel of the NAND flash, determining a number of the LUNs included in the LUN pair by
calculating a ratio of program cache busy time to data transmission time;
based on that the ratio is less than 1, determining that each LUN pair includes two LUNs; and
based on that the ratio is equal to M, determining that each LUN pair includes M+1 LUNs, where M is an integer greater than 1; and pairing all the LUNs in the channel so that each LUN pair includes the determined number of the LUNs; and
for each LUN pair, sequentially writing data to one same page in a plurality of pages corresponding to a program mode included in each word line of each LUN in the LUN pair, and after completing data writing to the same page of the word line of all the LUNs in the LUN pair, sequentially writing data to a next same page in the plurality of pages of the word line of each LUN in the LUN pair, until the data writing is sequentially performed on a last same page in the plurality of pages of the word line of each LUN in the LUN pair.

9. The data writing apparatus of claim 7, wherein
for each channel of the NAND flash, all the LUNs in the channel are paired so that each LUN pair includes a first LUN and a second LUN, wherein each word line of the first LUN and the second LUN includes an LP page, an MP page, and a UP page, respectively;
for each word line of each LUN pair, data writing is performed in a manner of:
performing data writing on the LP page of the first LUN in the LUN pair;
performing data writing on the LP page of the second LUN in the LUN pair;
performing data writing on the MP page of the first LUN in the LUN pair;
performing data writing on the MP page of the second LUN in the LUN pair;
performing data writing on the UP page of the first LUN in the LUN pair; and
performing data writing on the UP page of the second LUN in the LUN pair.

10. The data writing apparatus of claim 7, wherein
for each channel of the NAND flash, all the LUNs in the channel are paired so that each LUN pair includes a first LUN and a second LUN, wherein each word line of the first LUN and the second LUN includes an LP page, an MP page, a UP page, and a TP page, respectively;
for each word line of each LUN pair, data writing is performed in a manner of:
performing data writing on the LP page of the first LUN in the LUN pair;
performing data writing on the LP page of the second LUN in the LUN pair;
performing data writing on the MP page of the first LUN in the LUN pair;
performing data writing on the MP page of the second LUN in the LUN pair;
performing data writing on the UP page of the first LUN in the LUN pair;
performing data writing on the UP page of the second LUN in the LUN pair;
performing data writing on the TP page of the first LUN in the LUN pair; and
performing data writing on the TP page of the second LUN in the LUN pair.

11. The non-volatile computer-readable storage of claim 8, wherein
for each channel of the NAND flash, all the LUNs in the channel are paired so that each LUN pair includes a first LUN and a second LUN, wherein each word line of the first LUN and the second LUN includes an LP page, an MP page, and a UP page, respectively;
for each word line of each LUN pair, data writing is performed in a manner of:
performing data writing on the LP page of the first LUN in the LUN pair;

performing data writing on the LP page of the second LUN in the LUN pair;

performing data writing on the MP page of the first LUN in the LUN pair;

performing data writing on the MP page of the second LUN in the LUN pair;

performing data writing on the UP page of the first LUN in the LUN pair; and performing data writing on the UP page of the second LUN in the LUN pair.

12. The non-volatile computer-readable storage medium of claim 8, wherein for each channel of the NAND flash, all the LUNs in the channel are paired so that each LUN pair includes a first LUN and a second LUN, wherein each word line of the first LUN and the second LUN includes an LP page, an MP page, a UP page, and a TP page, respectively;

for each word line of each LUN pair, data writing is performed in a manner of:

performing data writing on the LP page of the first LUN in the LUN pair;

performing data writing on the LP page of the second LUN in the LUN pair;

performing data writing on the MP page of the first LUN in the LUN pair;

performing data writing on the MP page of the second LUN in the LUN pair;

performing data writing on the UP page of the first LUN in the LUN pair;

performing data writing on the UP page of the second LUN in the LUN pair;

performing data writing on the TP page of the first LUN in the LUN pair; and performing data writing on the TP page of the second LUN in the LUN pair.

* * * * *